(12) United States Patent
Nonaka et al.

(10) Patent No.: US 7,789,121 B2
(45) Date of Patent: Sep. 7, 2010

(54) SHEET STICKING APPARATUS AND STICKING METHOD

(75) Inventors: Hideaki Nonaka, Tokyo (JP); Kan Nakata, Tokyo (JP); Kenji Kobayashi, Tokyo (JP)

(73) Assignee: Lintec Corporation, Tokyo (JP)

( * ) Notice: Subject to any disclaimer, the term of this patent is extended or adjusted under 35 U.S.C. 154(b) by 32 days.

(21) Appl. No.: 11/994,911

(22) PCT Filed: Jun. 26, 2006

(86) PCT No.: PCT/JP2006/312685

§ 371 (c)(1),
(2), (4) Date: Jan. 7, 2008

(87) PCT Pub. No.: WO2007/007531

PCT Pub. Date: Jan. 18, 2007

(65) Prior Publication Data

US 2009/0065126 A1 Mar. 12, 2009

(30) Foreign Application Priority Data

Jul. 7, 2005 (JP) ............................. 2005-198806

(51) Int. Cl.
*B32B 37/10* (2006.01)
(52) U.S. Cl. ...................................... 156/378; 156/538
(58) Field of Classification Search ................ 156/250, 156/540, 378, 538
See application file for complete search history.

(56) References Cited

U.S. PATENT DOCUMENTS 5,961,768 A * 10/1999 Tsujimoto .................... 156/285
2005/0253013 A1* 11/2005 Benvenuti et al. ........... 242/417

FOREIGN PATENT DOCUMENTS

| JP | 6-268047 A | | 9/1994 |
| JP | 2004-47976 A | | 2/2004 |
| JP | 2005-116928 | * | 4/2005 |
| JP | 2005-136306 A | | 5/2005 |
| JP | 2005136306 | * | 5/2005 |

OTHER PUBLICATIONS

International Search Report of PCT/JP2006/312685, date of mailing Sep. 12, 2006.

* cited by examiner

*Primary Examiner*—Khanh Nguyen
*Assistant Examiner*—John Blades
(74) *Attorney, Agent, or Firm*—Westerman, Hattori, Daniels & Adrian, LLP

(57) ABSTRACT

A sheet sticking apparatus 10 comprises a sheet feed-out unit 12 for feeding out an adhesive sheet S to a position facing a surface of a semiconductor wafer W, and a press roller 14 for imparting a press force to the adhesive sheet S to stick the adhesive sheet S to the wafer W. The sheet feed-out unit 12 includes a tension measuring means 35 for measuring the tension of the adhesive sheet S between a feed-out head 49 and the press roller 14. The tension measuring means 35 maintains the tension to a constant level to prevent catching of air bubbles between the adhesive sheet S and the wafer W as well as to prevent warp deformation of the wafer stuck with the sheet.

4 Claims, 5 Drawing Sheets

SHEET STICKING APPARATUS AND STICKING METHOD

FIELD OF THE INVENTION

The present invention relates to a sheet sticking apparatus and a sticking method, particularly to a sheet sticking apparatus and a sticking method capable of sticking a sheet, when sticking a sheet to a plate-like object such as a semiconductor wafer, precisely to a predetermined position of the object.

BACKGROUND OF THE ART

Conventionally, semiconductor wafers (hereinafter, simply referred to as "wafer") are stuck with a protective sheet for protecting circuit surface thereof, and stuck with an adhesive sheet for die bonding on the rear surface thereof.

As the sheet sticking method described above, the following sticking method is known. That is, using a raw strip sheet in which a strip of adhesive sheet is temporarily stuck on a strip of release liner, the adhesive sheet is peeled off from the release liner, stuck onto a wafer, and then cut off along the periphery of the wafer (refer to, for example, patent document 1).

Patent document 1: Japanese Patent Application Laid-Open No. 2004-47976

SUMMARY OF THE INVENTION

Problem to be Solved by the Invention

However, in a sheet sticking apparatus disclosed in the patent document 1, there has not been positively employed such an arrangement so as to maintain constant tension during the operation of sticking an adhesive sheet onto a wafer.

Therefore, when the adhesive sheet is stuck with shortage of tension, such disadvantages may be resulted in that creases are generated on the adhesive sheet and/or air bubbles are caught between the adhesive sheet and the wafer. On the other hand, when an excessive tension is given to the adhesive sheet, such a disadvantage may be brought in that warp deformation is caused on the wafer after sticking the adhesive sheet.

Also, in the sheet sticking apparatus disclosed in the patent document 1, a set of guide rollers 28 for feeding out the adhesive sheet to a position facing the surface of the wafer is disposed. Since the guide rollers 28 nip constantly the adhesive sheet throughout sticking operation, cutting operation and peeling operation of the adhesive sheet, a line-like dent portion is formed on the adhesive layer of the adhesive sheet. Therefore, in the case of plate-like object such as the wafer, which is subjected to a grinding process to obtain an extremely thin thickness of several dozens micron, a sheet with a trace of line-like dent portion may cause an unevenness in thickness, or breakage of wafer in the grinding process. Thus, the area with the hollow portion cannot be used for the area to be stuck to the wafer. Although the sheet can be fed so that the area with the hollow portion is excluded, that case causes such a disadvantage that the sheet is consumed wastefully.

Object of the Invention

The present invention has been proposed in view of the above disadvantages. It is an object of the present invention to provide a sheet sticking apparatus and a sticking method capable of sticking a sheet by continuously measuring the tension of the sheet to maintain the tension constantly at a preset value during performing the sticking operation while giving a press force to the sheet with a press roller.

Also, another object of the present invention is to provide a sheet sticking apparatus and a sticking method capable of significantly suppressing wasteful consumption of the sheet by feeding the sheet of a length corresponding to the size of the plate-like object.

Means for Solving Problems

In order to achieve the above object, the present invention adopts such an arrangement that a sheet sticking apparatus, comprising: a sheet feed-out unit for feeding out a sheet to a position facing a surface of a plate-like object; and a press roller for imparting a press force to the sheet to stick the sheet from one end toward the other end of the plate-like object, wherein the sheet feed-out unit includes a tension measuring means for measuring the tension of the sheet between the sheet feed-out unit and the press roller, and the tension measuring means measures the tension constantly to maintain a constant tension while sticking the sheet to the plate-like object with the press roller.

In the present invention, the tension measuring means preferably includes a load cell and a tension measuring roller and is arranged such that when the load cell detects a change of the tension, the position of the tension measuring roller is shifted to maintain the constant tension.

Also, the present invention adopts such an arrangement that a sheet sticking apparatus, comprising: a sheet feed-out unit for feeding out a sheet to a position facing a surface of a plate-like object; and a press roller for imparting a press force to the sheet to stick the sheet from one end toward the other end of the plate-like object, wherein the sheet feed-out unit includes a sticking-angle maintaining means, and the sticking-angle maintaining means maintains the sticking angle of the sheet at a constant angle with respect to the plate-like object.

Further, the present invention adopts such an arrangement that the sheet feed-out unit includes a peel plate, the length of the sheet fed out between the front end of the peel plate and the press roller being set to be a little longer than the length from the one end to the other end of the plate-like object.

Furthermore, the present invention adopts such an arrangement that, when the sheet is stuck onto the plate-like object, the front end of the peel plate is positioned at the outside in the vicinity of the other end of the plate-like object.

Further, the present invention adopts such a sheet sticking method, in which a sheet is fed out from a sheet feed-out unit and pressed by a press roller to stick the same onto a plate-like object, and comprises the steps of: measuring the tension constantly while the press roller presses the sheet for sticking; and sticking the sheet onto the plate-like object while maintaining the tension at a constant level via a tension measuring means.

Moreover, the present invention adopts a sheet sticking method, in which a sheet is fed out from a sheet feed-out unit and the sheet is pressed by a press roller to stick the same onto a plate-like object, and comprising the step of sticking the sheet in a state that a sticking angle with respect to the plate-like object is maintained to a constant angle.

Furthermore, the above methods adopt such method that the sheet is stuck in a state that the length of the sheet fed out from the sheet feed-out unit to the press roller is kept a little longer than the length from the one end to the other end of the plate-like object.

Effect of the Invention

According to the present invention, the tension measuring means operates to maintain the constant tension of the sheet, and in this state, the press roller sticks the sheet while imparting the press force to the sheet. Consequently, no slack of the sheet is generated and no excessive tension is imparted thereto. Accordingly, crease generation, air bubble catching and warp deformation of the plate-like object can be avoided.

Also, such arrangement is adopted that the tension measuring roller shifts the position so as to maintain a constant tension in the load cell. Therefore, variation of the tension, which tends to occur accompanied by movement of the press roller, can be easily coped with.

Further, since the sticking angle of the sheet is constantly maintained by the sticking-angle maintaining means, even when the unstuck area of the fed out sheet becomes short as the press roller moves and the sticking of the sheet to the plate-like object progresses, the tension of the sheet can be easily maintained at a constant level.

Furthermore, the sticking is carried out in a state that the length of the sheet fed out between the front end of the peel plate and the press roller is set to be a little longer than the length from the one end to the other end of the plate-like object. Therefore, the area of the sheet continuing to the vicinity of the other end of the plate-like object can be used as the area to be stuck onto the next plate-like object. Accordingly, unused area or margin between the sheet areas stuck on the plate-like objects can be minimized, and thus wasteful consumption of the sheet can be eliminated.

Figure 1:
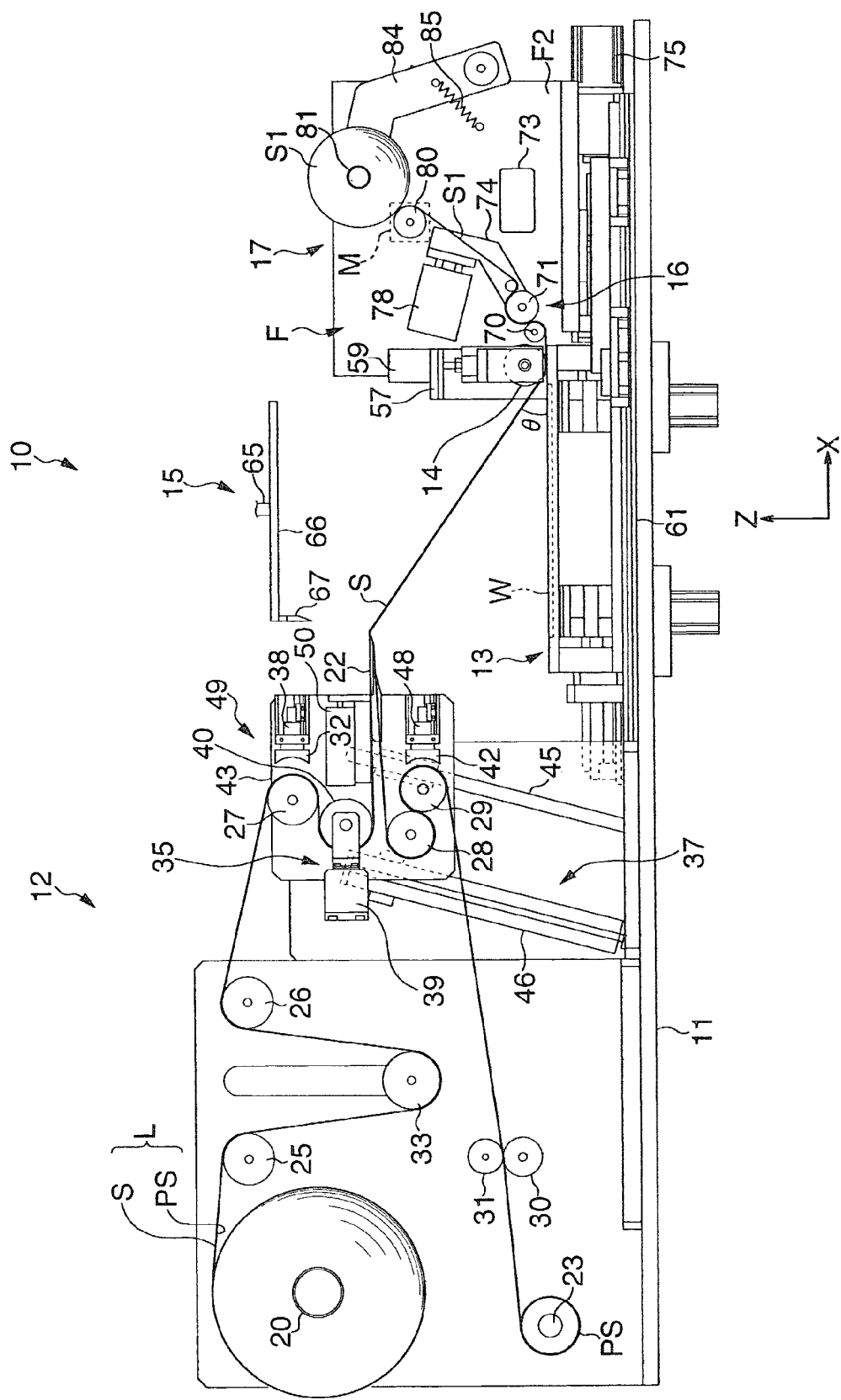
FIG. 1 is a front view schematically showing a sheet sticking apparatus in accordance with the embodiment.

EXPLANATION OF REFERENCE NUMERALS 10 sheet sticking apparatus
12 sheet feed-out unit
14 press roller
35 tension measuring means
39 load cell
40 tension measuring roller
37 sticking-angle maintaining means
L raw strip sheet
PS release liner
S adhesive sheet
S1 unnecessary adhesive sheet
W wafer (plate-like object)
θ sticking angle

DESCRIPTION OF THE PREFERRED EMBODIMENTS

Hereinafter, embodiments of the invention will be described with reference to the drawings.

Figure 2:
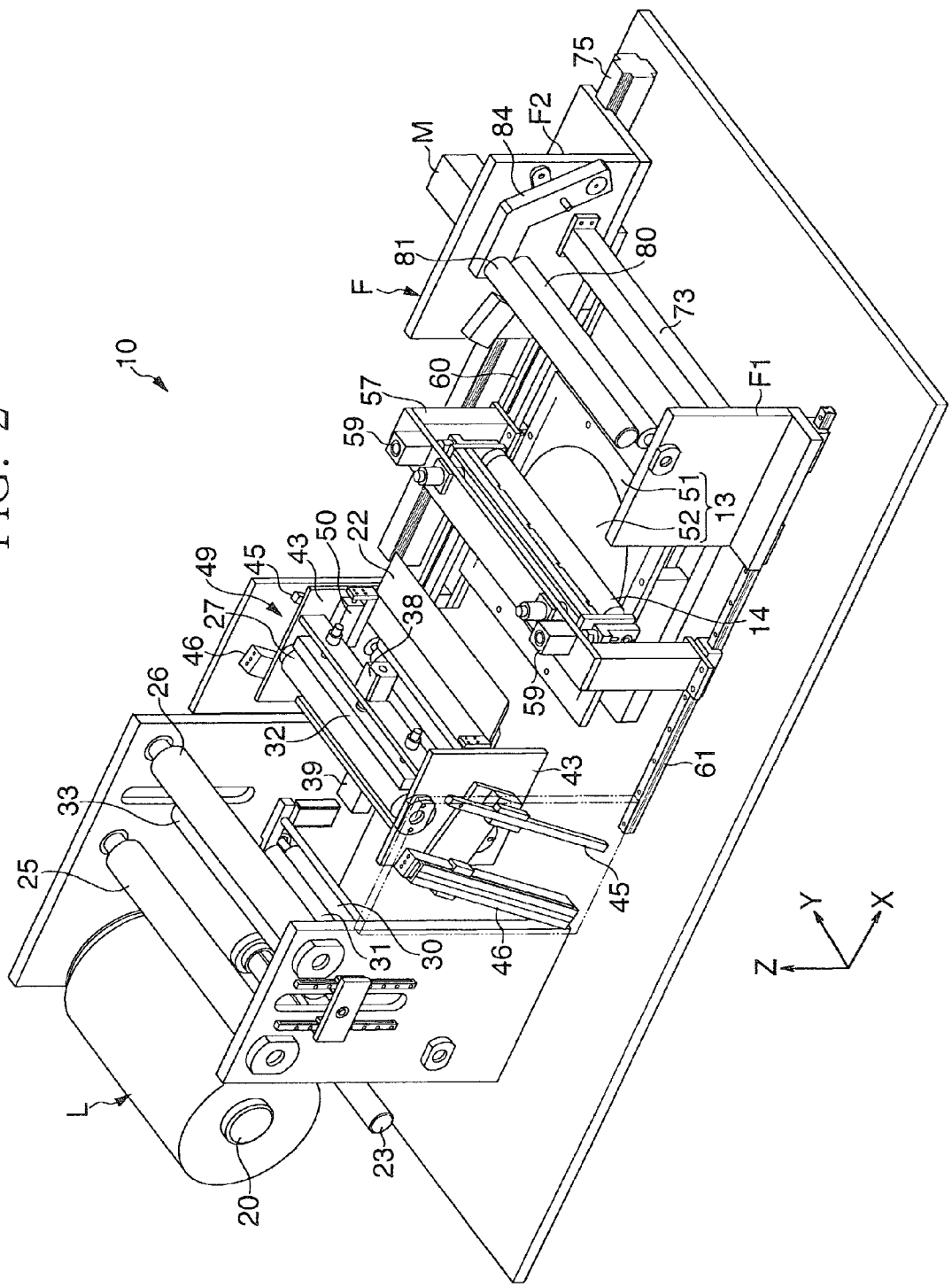
FIG. 2 is a perspective view schematically showing the sheet sticking apparatus.

FIG. 1 is a front view schematically showing a sheet sticking apparatus according to the embodiment; and FIG. 2 is a schematic perspective view thereof. In these figures, a sheet sticking apparatus 10 comprises: a sheet feed-out unit 12 disposed in the upper portion of a base 11; a table 13 for supporting a wafer W as a plate-like object; a press roller 14 for imparting a press force to an adhesive sheet S fed out to the upper surface side of the wafer W to stick the adhesive sheet S to the wafer W; a cutter 15 for cutting the adhesive sheet S along the outer periphery of the wafer W after sticking the adhesive sheet S to the wafer W; a peeling apparatus 16 for peeling off unnecessary adhesive sheet S1 outside the wafer W from the upper surface of the table 13; and a winding apparatus 17 for winding the unnecessary adhesive sheet S1.

The sheet feed-out unit 12 comprises: a support roller 20 for supporting a rolled raw strip sheet L in which the strip of adhesive sheet S is temporarily stuck on one surface of a strip of a release liner PS; a peel plate 22 with which the raw strip sheet L fed out from the support roller 20 is sharply folded back to peel off the adhesive sheet S from the release liner PS; a collection roller 23 for collecting the release liner PS by winding the same; a plurality of guide rollers 25 to 31 disposed between the support roller 20 and the collection roller 23; a buffer roller 33 disposed between the guide rollers 25 and 26; a tension measuring means 35 disposed between the guide rollers 27 and 28; and a sticking-angle maintaining means 37 for integrally supporting the peel plate 22, guide rollers 27, 28, 29 and the tension measuring means 35. Note that the guide rollers 27 and 29 are concomitantly provided with brake shoes 32 and 42 respectively. These brake shoes 32 and 42 are arranged so as, when sticking the adhesive sheet S to the wafer W, to be moved toward/away from the corresponding guide roller 27, 29 by means of cylinders 38 and 48 respectively, to nip the adhesive sheet S to restrain the feeding thereof.

The tension measuring means 35 comprises a load cell 39 and a tension measuring roller 40 supported by the load cell 39 and located at the base side of the peel plate 22. The tension measuring roller 40 is pulled by a tension of the adhesive sheet S, which is nipped by the guide roller 27 and the brake shoe 32 and is fed out to the press roller 14, and the tension is transmitted to the load cell 39. And there is such an arrangement that while the load cell 39 measures the tension of the adhesive sheet S fed out, a feed-out head 49, which will be described later, moves downward at an angle in FIG. 1 via the sticking-angle maintaining means 37 so that the tension of the adhesive sheet S is maintained at a constant level.

The sticking-angle maintaining means 37 is arranged to interact with the press roller 14 so as to maintain the sticking angle θ of the adhesive sheet S with respect to the wafer W to a constant angle. The sticking-angle maintaining means 37 comprises: a feed-out head 49, including guide rollers 27, 28 and 29, the load cell 39, the tension measuring roller 40, brake shoes 32 and 42, cylinders 38 and 48, the peel plate 22 and a pair of slide plates 43 and 43 for supporting above items; a pair of guide rails 45, 45 for vertically guiding the feed-out head 49; and a pair of uniaxial robots 46 and 46 for imparting a force to the feed-out head 49 to move in the vertical direction. The guide rails 45 and the uniaxial robots 46 are disposed in an inclined posture enabling to move the feed-out head 49 vertically along the inclined angle. Note that the peel plate 22 is supported by a cylinder 50 disposed at the inner side of the slide plates 43 enabling to move forward and backward in the X-direction in FIG. 1. Owing to this, the front edge position of the peel plate 22 can be adjusted in accordance with the diameter of the wafer W.

Figure 3:
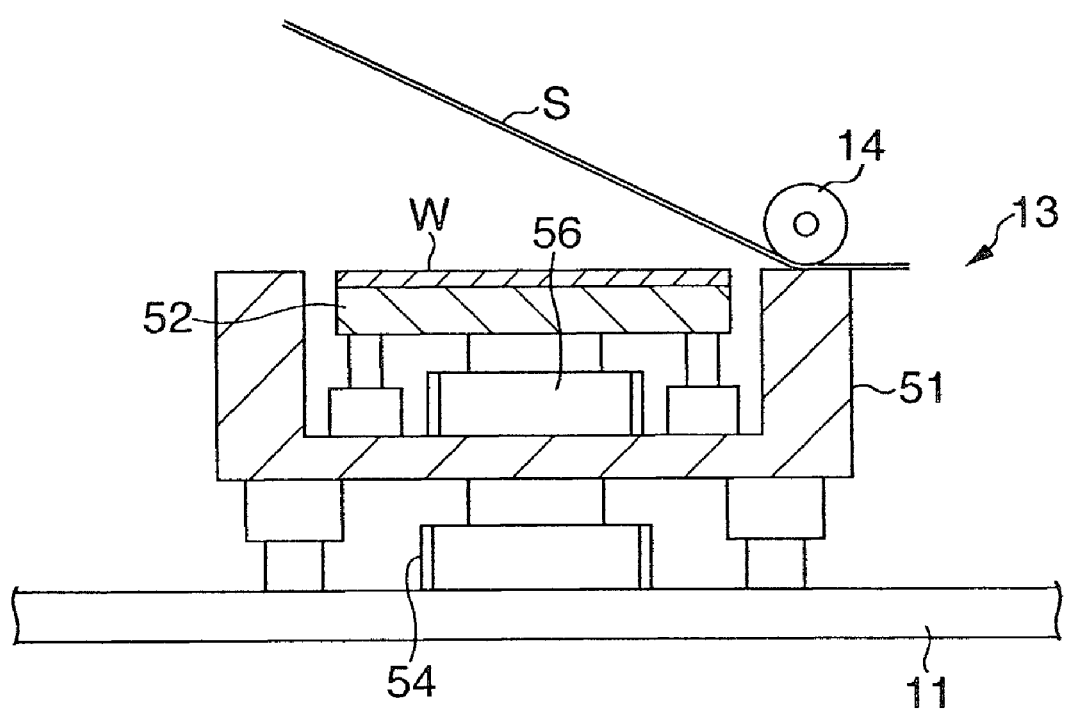
FIG. 3 is a cross sectional view schematically showing a table.

As shown in FIG. 3, the table 13 comprises: an outer table 51 having a substantially square shape in plane view; and an inner table 52 having a substantially circular shape in plane view. The outer table 51 is configured in a concave-shape so as to receive the inner table 52, and is arranged so as to move in the vertical direction with respect to the base 11 via a uniaxial robot 54. On the other hand, the inner table 52 is arranged so as to move in the vertical direction with respect to the outer table 51 via a uniaxial robot 56. Accordingly, the outer table 51 and the inner table 52 are arranged so as to move integrally in the vertical direction as well as to move in the vertical direction independently each other. Owing to this, the outer table 51 and the inner table 52 are arranged to be adjustable to a predetermined level position corresponding to the thickness of the adhesive sheet S and the wafer W.

The press roller 14 is supported via a portal frame 57. On the upper face side of the portal frame 57, cylinders 59, 59 are provided. The press roller 14 is arranged so as to move in the vertical direction owing to the operation of these cylinders 59. Incidentally, as shown in FIG. 2, the portal frame 57 is arranged to be movable in the X-direction in FIG. 1 via the uniaxial robot 60 and the guide rail 61.

The cutter 15 is provided movably in the vertical direction via a lifter (not shown) above the table 13. The cutter 15 comprises: a rotation arm 66 fixed to a rotation center shaft 65, and a cutter blade 67 supported by the rotation arm 66. When the cutter blade 67 is rotated around the rotation center shaft 65, the adhesive sheet S can be cut along the outer periphery of the wafer W.

As shown in FIGS. 1, 4 and 5, the peeling apparatus 16 comprises a small diameter roller 70 and a large diameter roller 71. A moving frame F supports the small diameter roller 70 and the large diameter roller 71. The moving frame F comprises a front frame F1 and a rear frame F2, which are opposing to each other in the Y-direction in FIG. 2, the rear frame F2 being connected to the front frame F1 via a connecting member 73. The rear frame F2 is supported by a uniaxial robot 75, while the front frame F1 is supported by the guide rail 61. Owing to this, the moving frame F is movable in the X-direction in FIG. 2. An arm member 74 supports the large diameter roller 71 as shown in FIG. 1. The arm member 74 is arranged so that a cylinder 78 can move the large diameter roller 71 in the direction closer to/away from the small diameter roller 70.

The winding apparatus 17 comprises: a drive roller 80 supported by the moving frame F; and a winding roller 81, which is supported at the free-end of the rotation arm 84 being abutted on the circumferential surface of the drive roller 80 via a spring 85 to nip the unnecessary adhesive sheet S1. A drive motor M is disposed at the shaft end of the drive roller 80, and it is arranged so that, when the drive roller 80 is driven to rotate by the motor M, the winding roller 81 follows the drive roller 80 to rotate; thereby the unnecessary adhesive sheet S1 is wound thereon. Note that as the wound amount increases, the winding roller 81 shifts rightward in FIG. 1 against the force of the spring 85.

Next, the sticking method of the adhesive sheet S in accordance with the embodiment will be described with reference to FIGS. 4 and 5 as well.

In the initial setting, in the raw strip sheet L, which is fed out from the support roller 20, the adhesive sheet S is peeled off from the release liner PS at the front edge position of the peel plate 22, and the lead end of the release liner PS is fixed to the collection roller 23 through the guide rollers 28, 29. On the other hand, the lead end of the adhesive sheet S is fixed to the winding roller 81 of the winding apparatus 17 through the press roller 14 and the peeling apparatus 16. Here, the peel plate 22 constituting the front end of the feed-out head 49 is positioned at its upper limit position (refer to FIG. 1 and FIG. 4(A)). And the adhesive sheet S between the peel plate 22 and the press roller 14 is set so as to have a predetermined sticking angle θ with respect to the surface of the wafer W disposed on the table 13 as shown in FIG. 1. Also, the position of the front end of the peel plate 22 is adjusted by the cylinder 50 so that the length of the adhesive sheet S between the peel plate 22 and the press roller 14 is a little longer than the length from the one end to the other end, i.e., from the right end to the left end of the wafer W in FIG. 4.

In a state that the wafer W is set on the table 13 by means of a transfer arm (not shown), the sticking operation starts. Before sticking operation starts, the brake shoes 32, 42 are brought into contact with the guide rollers 27, 29 to restrain the adhesive sheet S from being fed out. In a state that the table 13 is at a standstill, the press roller 14 rotates and moves on the wafer W leftward in FIG. 4. When the press roller moves, a tension is applied to the adhesive sheet S, and the tension measuring roller 40 is pulled in the X-direction. Then, the load cell 39 measures the tension, and thereby the feed-out head 49 is lowered at an angle by using the sticking-angle maintaining means 37 to maintain a predetermined tension. That is, the load cell 39 measures the tension, and is controlled to output an instruction to the pair of uniaxial robots 46 to maintain the predetermined tension based on the data.

Therefore, as a result, the feed-out head 49 gradually descends along the inclined angle of the guides 45 and uniaxial robots 46 (refer to FIG. 1). Owing to this, even when the length of the adhesive sheet S between the front end of the peel plate 22 and the press roller 14 becomes shorter, the sticking angle θ is maintained constantly to a constant angle.

Figure 4A:
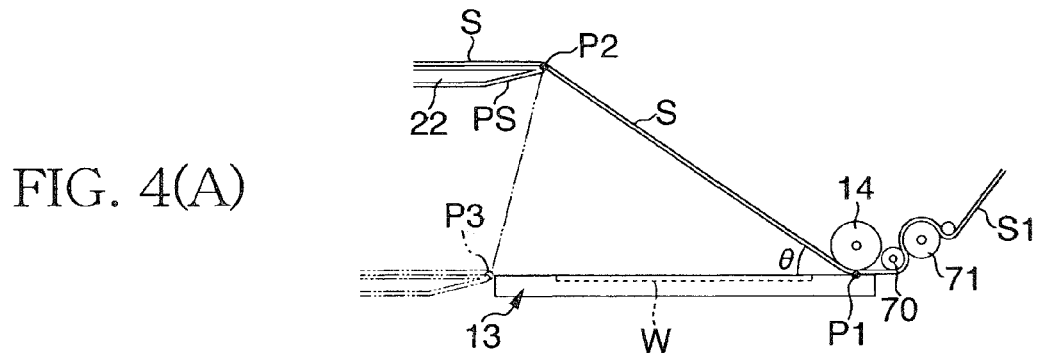
FIGS. 4(A) to 4(E) are explanatory views showing sticking operation of adhesive sheet.
Figure 4B:
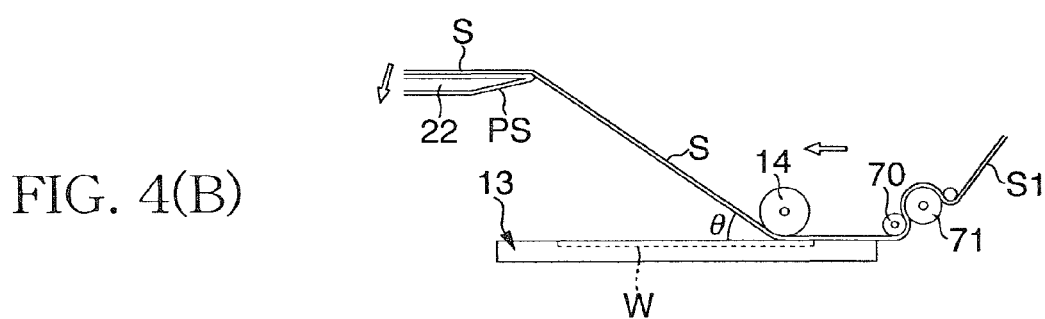
Figure 4C:
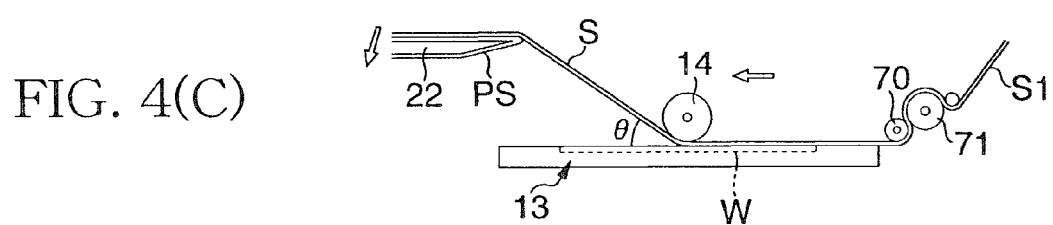

In this embodiment, as described above, during the sticking operation of the press roller 14, the feed-out head 49 is lowered while the tension of the adhesive sheet S being measured with the load cell 39. As a result, the sticking angle θ is maintained. However, control of descent of the feed-out head 49 may eliminate the load cell 39. That is, as shown in FIG. 4(A), assuming that the lowermost position of the press roller 14 and the front edge position of the peel plate 22 at the start point of the sticking operation be P1 and P2 respectively; the front edge position of the peel plate 22 at the point when the sticking operation of the adhesive sheet S has been completed be P3; and the sticking angle formed by P2, P1 and P3 be θ, the following arrangement may also be adopted. That is, the uniaxial robots 46 and 60 are controlled synchronously to lower the feed-out head 49 constituting the sticking-angle maintaining means 37 along the guide bars 45 so that, as the press roller 14 moves and the distance between the points P1 and P3 is made smaller by the uniaxial robot 60, the level of the peel plate 22, that is the distance between the points P2 and P3 also becomes shorter, and thus the sticking angle θ is constantly maintained. Note that the movement amount of the feed-out head 49 is readily calculated by using the trigonometric function. Thus, by constantly maintaining the sticking angle θ based on the detection of the movement distance of the press roller 14, the same operation and effect as those of the tension control using the load cell 39 can be obtained. In the present invention, these control methods can be employed selectively.

Figure 4D:
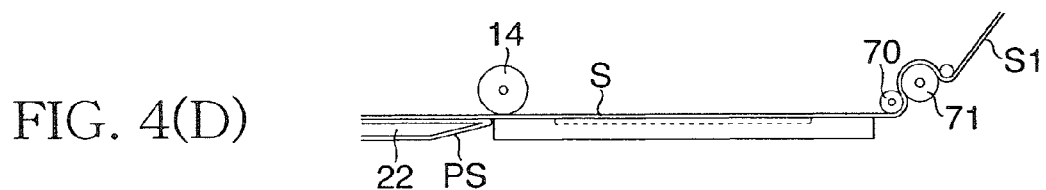
Figure 4E:
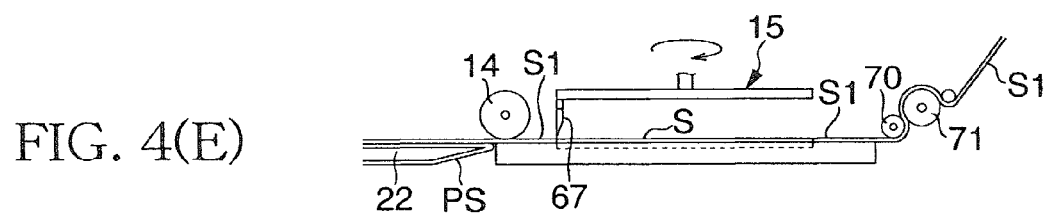
Figure 5A:
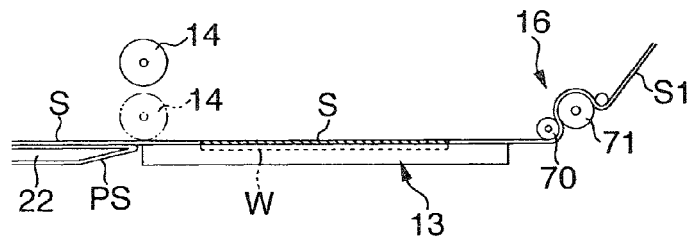
FIGS. 5(A) to 5(D) are explanatory views showing peeling operation of unnecessary adhesive sheet by a peeling apparatus.
Figure 5B:
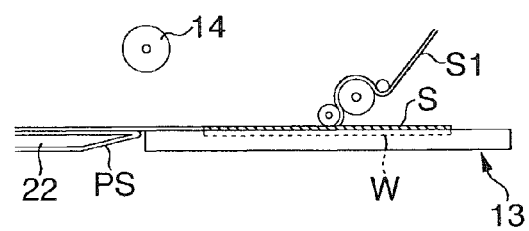
Figure 5C:
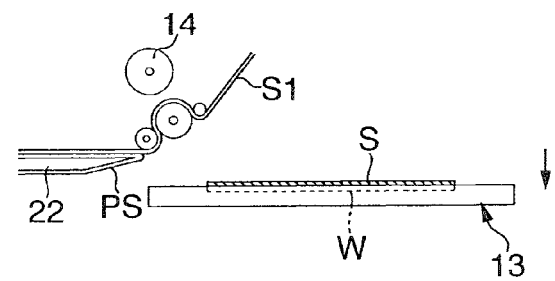
Figure 5D:
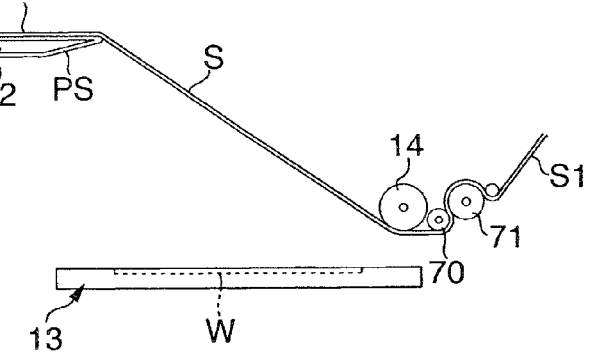

As shown in FIGS. 4(D) and 4(E), when the sticking operation of the adhesive sheet S has been completed, the cutter 15 descends to cut the adhesive sheet S along the peripheral edge of the wafer W, and then the cutter 15 goes up to return to the initial position (refer to FIG. 1). At this time, the front end of the peel plate 22 is positioned in the vicinity of the left end of the wafer W. Owing to this, the area of the adhesive sheet existing at the left side from the front edge position of the peel plate 22 can be used as the area to be stuck to the next wafer W, thus the adhesive sheet S is prevented from being consumed wastefully.

Then, after the wafer W is removed from the table 13 by means of the transfer apparatus, as shown in FIGS. 5(A) to 5(D), the press roller 14 goes up, and the small diameter roller 70 and the large diameter roller 71 constituting the peeling apparatus 16 move leftward. And the drive roller 80 of the winding apparatus 17 is driven to wind the unnecessary adhesive sheet S1; thus the unnecessary adhesive sheet S1 around the wafer W can be peeled off from the upper surface of the table 13.

Then, the brake shoes 32, 42 move away from the guide rollers 27, 29 so that the raw strip sheet L can be fed out, and in a state that the drive roller 80 is locked, the peeling apparatus 16 and the winding apparatus 17 return to the initial position. As a result, new adhesive sheet S is pulled out and new wafer W is transferred onto the table 13 again.

Therefore, according to the embodiment as described above, since such arrangement is employed that the tension of the adhesive sheet S is maintained to a constant level while sticking the adhesive sheet S to the wafer W, such advantage can be obtained that air bubbles catching due to insufficient tension or warp deformation of the wafer due to excessive tension can be effectively prevented.

The best arrangement, method and the like for carrying out the present invention have been disclosed so far. However, the present invention is not limited to the above.

That is, the present invention has been illustrated and described mainly about a specific embodiment. However, it is possible for those skilled in the art to add various modifications, if necessary, to the above-described embodiment with respect to the shape, position and/or disposition without departing from the technical spirit and the range of the object of the present invention.

For example, in the above-described embodiment, the case where the press roller 14 is moved to stick the adhesive sheet S in a state that the table 13 is at a standstill has been illustrated and described. However, such arrangement that the table 13 is caused to move may be employed. Also, the sticking angle θ is not particularly limited.

Further, in the above-described embodiment, an example in which the plate-like object is the wafer has been described. However, the present invention is applicable to such arrangement that a sheet or film is stuck on a plate-like object other than wafer.

The invention claimed is:

1. A sheet sticking apparatus, comprising:
   a table for supporting an object which has a plate shape;
   a sheet feed-out unit for feeding out a sheet to a position above an upper surface of a first end of the table;
   a press roller positioned above the first end of the table and designed to travel in a generally horizontal direction to an opposite second end of the table, imparting a downward force to said sheet to stick the sheet from one end toward the other end of the object;
   a sheet feed-out head including a tension measuring means for measuring tension of the sheet between the sheet feed-out unit and the press roller; and
   a robot for moving the entire feed-out head based on a measuring result of the tension measuring means so as to maintain the tension of the sheet constantly while sticking the sheet to the object with said press roller.

2. The sheet sticking apparatus according to claim 1, the feed-out unit comprising:
   a peel plate, a front end of which is positioned outside of said other end of the object when said sheet is stuck onto the object; and
   a load cell, wherein
   when the load cell detects a change in the tension, a position of a tension measuring roller is shifted to maintain the tension to a constant level.

3. The sheet sticking apparatus according to claim 2, wherein the length of the sheet fed out between the front end of the peel plate and the press roller being set to be longer than the length from the one end to the other end of the object.

4. The sheet sticking apparatus according to claim 1, wherein the sheet feed-out head comprises a plurality of rollers in contact with the sheet.

* * * * *